(12) United States Patent
Hargreaves

(10) Patent No.: US 8,803,523 B2
(45) Date of Patent: Aug. 12, 2014

(54) FLEXIBLE ORDERING FOR MULTIPLE SLICE MRI

(75) Inventor: Brian A. Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 390 days.

(21) Appl. No.: 13/366,086

(22) Filed: Feb. 3, 2012

(65) Prior Publication Data

US 2013/0200892 A1    Aug. 8, 2013

(51) Int. Cl.
*G01V 3/00*    (2006.01)

(52) U.S. Cl.
USPC .......................................... 324/309

(58) Field of Classification Search
USPC ........................... 324/300–322; 600/410–435
See application file for complete search history.

(56) References Cited

U.S. PATENT DOCUMENTS

| | | | | |
|---|---|---|---|---|
| 5,657,757 A | * | 8/1997 | Hurd et al. | 600/413 |
| 6,618,605 B1 | * | 9/2003 | Wolff et al. | 600/410 |
| 7,647,088 B2 | * | 1/2010 | Mistretta et al. | 600/428 |
| 2013/0200892 A1 | * | 8/2013 | Hargreaves | 324/309 |

FOREIGN PATENT DOCUMENTS

EP    1083437 A2 *  3/2001 ........... G01R 33/563

\* cited by examiner

*Primary Examiner* — Dixomara Vargas
(74) *Attorney, Agent, or Firm* — Lumen Patent Firm

(57) ABSTRACT

A method of ordering slices for interleaved MRI is provided that includes selecting a number of interleaved slice locations ($N_S$) each having a plurality of excitations ($N_{E,S}$), where S is the slice number between 1 and $N_S$ and $N_{E,S}$ may differ for different slice numbers, selecting an excitation duration ($T_S$) of each the excitation in each the slice, selecting a repetition time (TR) between successive excitations of the same slice, TR has a duration of $N_i \times T_S$, $N_i$ is the number of interleaved slices per TR period, and arranging the order for the slices such that the total scan time (T) is minimized such that TR is the product of $N_i$ and $T_s$, where $N_i$ can be arbitrarily chosen between 1 and $N_T/N_{E,max}$ where $N_T$ is the total number of excitations for all the slices and where $N_{E,max}$ is the maximum number of the excitations for one slice.

9 Claims, 9 Drawing Sheets

FLEXIBLE ORDERING FOR MULTIPLE SLICE MRI

FIELD OF THE INVENTION

The invention relates to magnetic resonance imaging. More particularly, the invention relates to a method of interleaving multiple slices in MRI, such that the TR is not limited by the number of slices, and enables cases when different slices require different numbers of excitations.

BACKGROUND OF THE INVENTION

In MRI it is often desirable to excite and receive a signal from multiple excited slices (or volumes). Interleaved multi-slice imaging is very efficient, as different slices can be excited and imaged while magnetization from other slices recovers. However, the desired TR and TE for contrast, as well as the time required to play pulses for a given slice and number of slices force certain constraints on how slices are interleaved. Additionally, for T1-weighted imaging, the number of slices that can be interleaved within the desired repetition time (TR) is often limited. This leads to suboptimal contrast if TR is increased to accommodate all slices, or increased scan time if multiple acquisitions are needed.

What is needed is highly flexible approach to ordering slices for interleaved imaging.

SUMMARY OF THE INVENTION

To address the needs in the art, a method of ordering slices for interleaved magnetic resonance imaging (MRI) is provided that includes selecting a number of interleaved slice locations ($N_S$) using an MRI machine, where each interleaved slice includes a plurality of excitations ($N_{E,S}$) where S is the slice number between 1 and $N_S$ and $N_{E,S}$ may differ for different slice numbers, selecting an excitation duration ($T_S$) of each of the excitation and imaging periods for each slice using the MRI machine, selecting a repetition time (TR), using the MRI machine, between successive excitations of the same slice, where the TR has a duration of $N_i \times T_S$, where $N_i$ is the number of interleaved slices per TR period, and arranging the order for the slices such that the total scan time (T) is minimized such that TR is the product of $N_i$ and $T_s$, where $N_i$ can be arbitrarily chosen between 1 and $N_T/N_{E,max}$ where $N_T$ is the total number of excitations for all the slices and where $N_{E,max}$ is the maximum number of the excitations for one slice.

According to one aspect of the invention, the order is determined by filling a matrix that has $N_i$ horizontal elements and a number of rows equal to a ratio ($N_T/N_i$) rounded up to the nearest integer, where the matrix is filled one column at a time with the $N_{E,S}$ excitations for each of the $N_S$ slices, and then the order is played out from the matrix along the rows to interleave the excitations for each slice.

In another aspect of the invention, at least one 'dummy' acquisition is disposed to precede the $N_{E,S}$ excitations and disposed to acquire each slice with a result that the dummy acquisition is played each time the slice number differs from the excitation that was played $N_i$ acquisition periods prior to a current acquisition, where a steady-state acquisition is achieved.

In a further aspect of the invention, a 'dummy' acquisition is played for the first one or more entire TR periods with data discarded, where a steady state may form prior to acquisition for each slice.

According to another aspect of the invention, the method is used with arbitrary ordering schemes of the excitations for each slice ($N_{E,S}$) that can include random, centric, elliptic-centric, segmented Echo Planar Imaging (EPI), interleaved EPI, interleaved radial or interleaved spiral.

In one aspect of the invention, the method is used with arbitrary echo-train ordering schemes that can include random, center-out, sequential, intermediate-weighted or T2-weighted echo orders.

In yet another aspect of the invention, the method includes arbitrary view coverage schemes that can include partial Fourier acquisition, parallel imaging acquisitions or randomized undersampled acquisitions.

In a further aspect of the invention, the slice numbers are reassigned to result in a different final ordering that can be beneficial.

According to another aspect of the invention, the ordering is formed by determining an the overall order using the MRI machine, where the slice numbers are then reassigned to arbitrary slices, where an odd-then-even order is achieved by assigning the odd physical slice locations to the first $N_S/2$ slice-order slots, and the even physical slice locations are assigned to the remaining slots.

BRIEF DESCRIPTION OF THE DRAWINGS

FIGS. 3a-7b show example results of different possible slice orders for different cases that are embodiments of the current invention.

DETAILED DESCRIPTION

Figure 1:
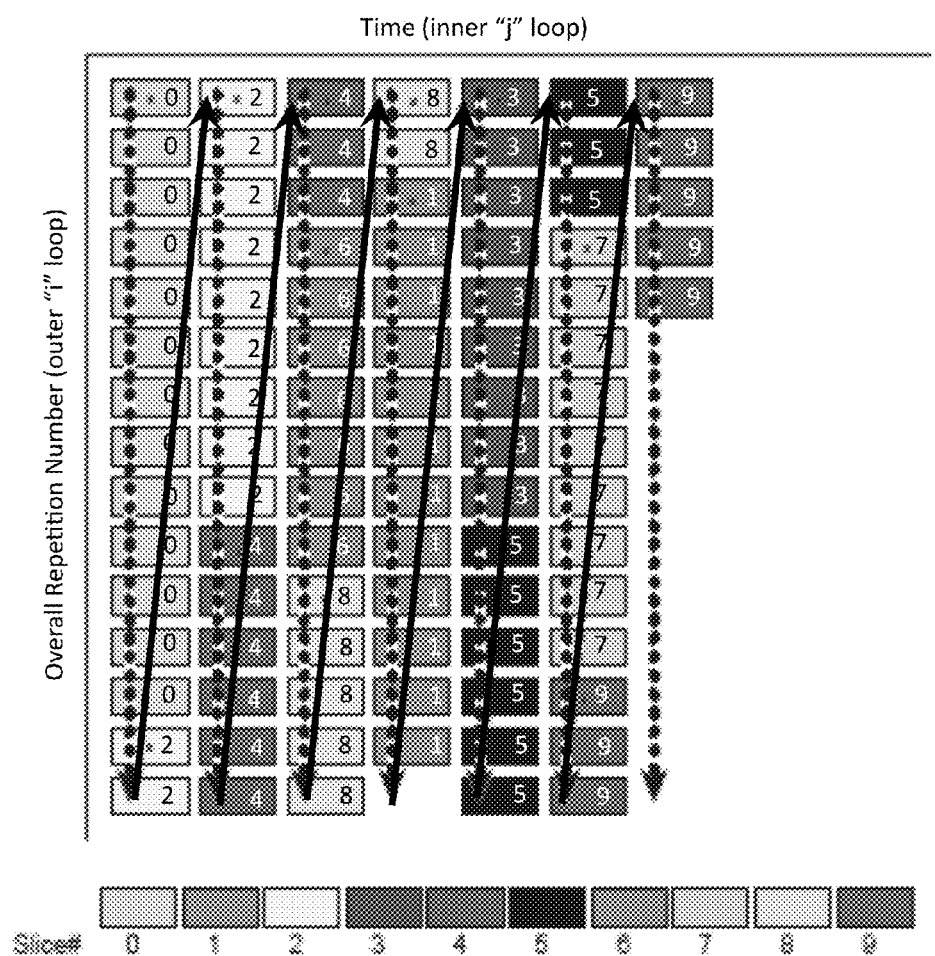
FIG. 1 shows how the flexible slice interleaving algorithm fills the columns of a matrix with the excitations for each slice and is then accessed row-by-row during the scan, according to one embodiment of the invention.

This invention provides a method for efficiently interleaving multiple slices when the total number of interleaved slices per TR does not evenly divide the total number of slices, and for the case when the total number of excitations to encode a slice varies for different slices. The key step is to allow the excitation number within the slice to vary across a TR, unlike conventional imaging. The order is achieved by filling a matrix first along the TR dimension, then along the "slice-within-TR" dimension. The excited slices and excitation within slice are then played out in the transposed order, "slice-within-TR" first.

This method is important in maintaining a given TR despite different requirements on number of slices, duration required to excite/image each slice on each TR, and number of encoding steps per slice. Often in clinical imaging, the TR is extended to allow multiple slices, resulting in poor image contrast, particularly in T1-weighted scans.

More specifically, a method of ordering slices for interleaved magnetic resonance imaging (MRI) is provided that includes selecting a number of interleaved slice locations ($N_S$) using an MRI machine, where each interleaved slice includes a plurality of excitations ($N_{E,S}$), and where S is the slice number between 1 and $N_S$ and $N_{E,S}$ may differ for different slice numbers. The method further includes selecting an excitation duration ($T_S$) of each of the excitation and imaging periods for each slice using the MRI machine, selecting a repetition time (TR), using the MRI machine, between successive excitations of the same slice, where the TR has a duration of $N_i \times T_S$, where $N_i$ is the number of interleaved slices per TR period, and arranging the order for the slices such that the total scan time (T) is minimized such that TR is the product of $N_i$ and $T_S$, where $N_i$ can be arbitrarily chosen between 1 and $N_T/N_{E,max}$ where $N_T$ is the total number of excitations for all the slices and where $N_{E,max}$ is the maximum number of the excitations for one slice.

As an example, assume there are $N_s$ slices, each requiring a time $T_s$ for imaging. If $N_i$ slices are "interleaved" per TR, then the minimum TR is normally $N_i T_s$. If $N_i = N_s$, then the slices are all acquired in one "acquisition." However, often $N_s < N_s$ and more than one acquisition is used, in order to use a shorter TR. Typically, the number of acquisitions, $N_a$ is equal to $N_s/N_i$, but rounded up. Alternatively, often the TR is automatically or manually adjusted so that $TR = N_s T_s$, but this may alter image contrast.

According to one embodiment of the invention, a very flexible selection of $N_i$ (and TR) can be provided, as well as providing the overall slice ordering for the acquisition.

Specific examples of what the current embodiment of the invention offers are:
1) It enables efficient acquisition for standard multislice scanning with $N_i < N_s$. This allows specific selection of TR without modifying TR for efficiency, which effectively allows a "fractional" number of acquisitions.
2) It enables efficient scanning when the total number of excitations (or "pops") for different slices can vary. This could be due to variable averaging, field of view (FOV), acceleration factor, resolution or other parameters over different slices.

An exemplary algorithm is presented for the case (2) above, as shown in FIG. 1. The interleave ordering is designed using an inner loop of Ni slices (across in FIG. 1), and an outer loop that repeats the inner loop $N_{tr}$ times (down in FIG. 1). For each nth slice, n=1 ... $N_s$, the number of excitations needed, $P_n$ are given. As shown in FIG. 1, according to one embodiment, the flexible slice-interleaving algorithm fills the columns of a matrix with the excitations for each slice. The matrix is then accessed row-by-row during the scan. Although $N_{tr}$ can be chosen based on an estimated $N_i$, the algorithm may need to be repeated to achieve an exact $N_i$, because of dummy excitations.

Specifically, an algorithm for efficient multi-slice ordering includes:
1) Choosing a number of TR's at least as great as maximum number of "pops" (excitations) per slice, to approximately achieve a certain number ($N_i$) of slices per TR.
2) Filling up columns sequentially for each slice (Mappings such as center-out or odd-then-even can be applied before this step).
3) A minimum inner-loop time will result, where the total "area" is roughly constant.
4) Starting each new color with a dummy acquisition (*), in some cases discarding.
5) Repeat the whole scheme if a different $N_i$ is desired, either increasing or decreasing the number of TRs to decrease or increase $N_i$ respectively.

Four counters are used, one for j=1 ... $N_i$, and one for i=1 ... $N_{tr}$. Two matrices S and P define the slice and excitation within that slice, with row and column specified by i and j respectively. Two other counters indicate the slice (s) and excitation within the slice (p) and p=0 indicates a dummy view.

The algorithm is generalized as follows: Fill the matrices S and P with the slice number and excitation within the slice, filling first columns (i), then rows (j). Increment the excitation number until all acquisitions have happened for the current slice, then start filling for the new slice. Also, ensure the first excitation for a slice is a dummy view, and that all excitations in the first TR are dummy views. (The slices are then played out across the j loop, then the i loop.)

The detailed version is:

---

1) Begin with i=j=1, and define p=0 and n=1.
2) Loop while n<=Ns
    If p is greater than Pn
        Increment s
        Reset p=0
    If i>Ntr then increment j and reset i.
    if (n <= Ns)
        If i=1 set Pij=0,
        If p=0, set p=1.
        Else (i!=0)
            Set Pij=p and increment p.
        Set Si j=n and increment i.

---

If $N_d$ dummy acquisitions are required, then a conservative choice for $N_{tr}$ that is guaranteed to work is to set $N_{tr}$ to the total number of pops for all slices plus twice $N_d$, all divided by $N_i$. At worst this will require $N_d$ extra TRs over the minimum number, which is usually insignificant, with the benefit of providing a non-iterative solution.

Figure 2:
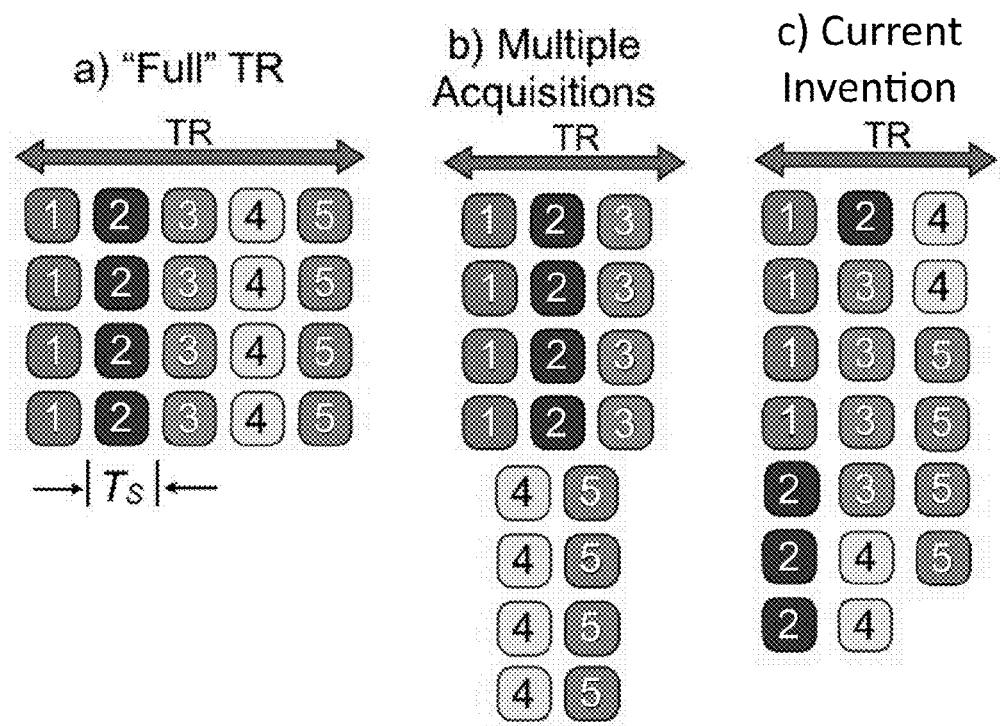
FIGS. 2a-2c show a multislice acquisition with 5 slices, each requiring 4 excitations, according to one embodiment of the invention.
Figure 3:
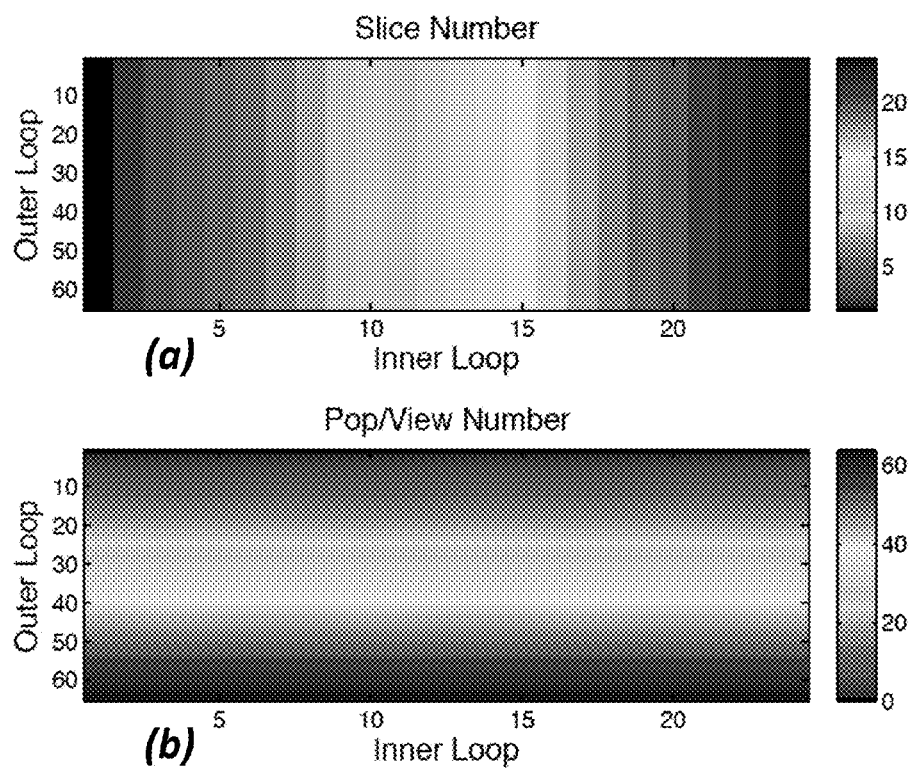
Figure 4:
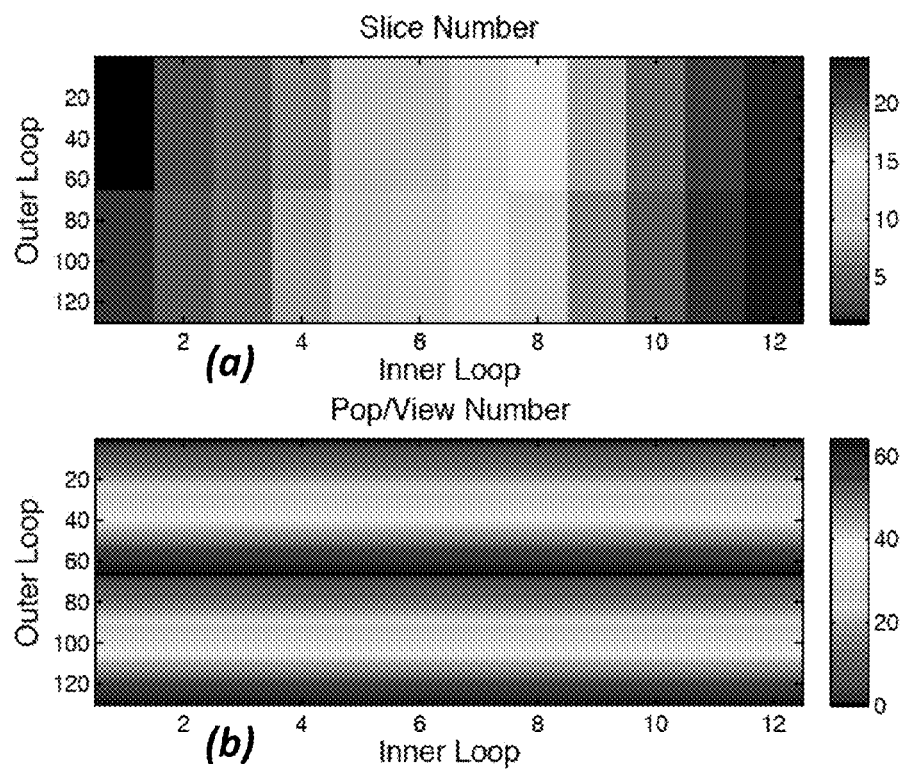
Figure 5:
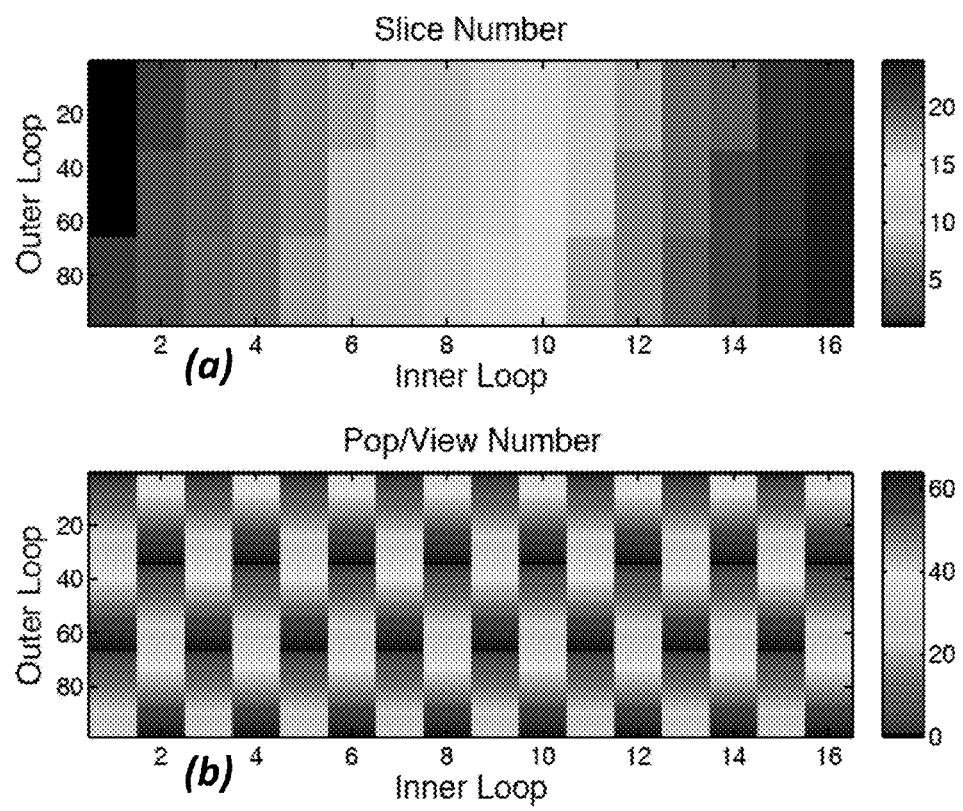
Figure 6:
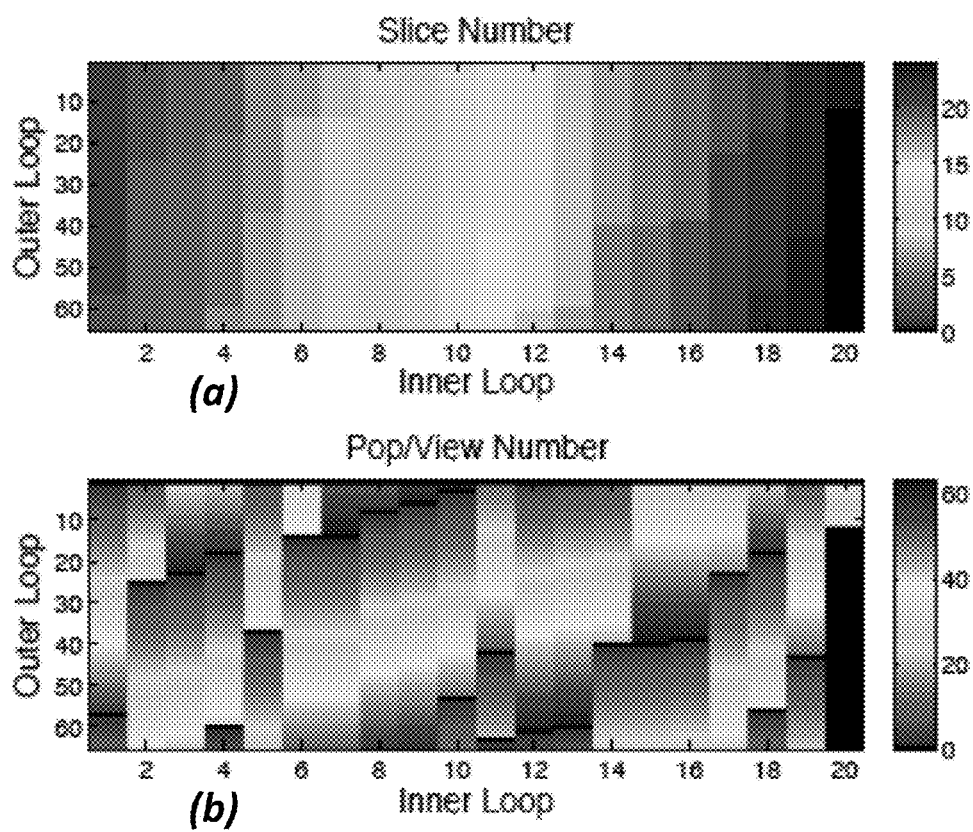
Figure 7:
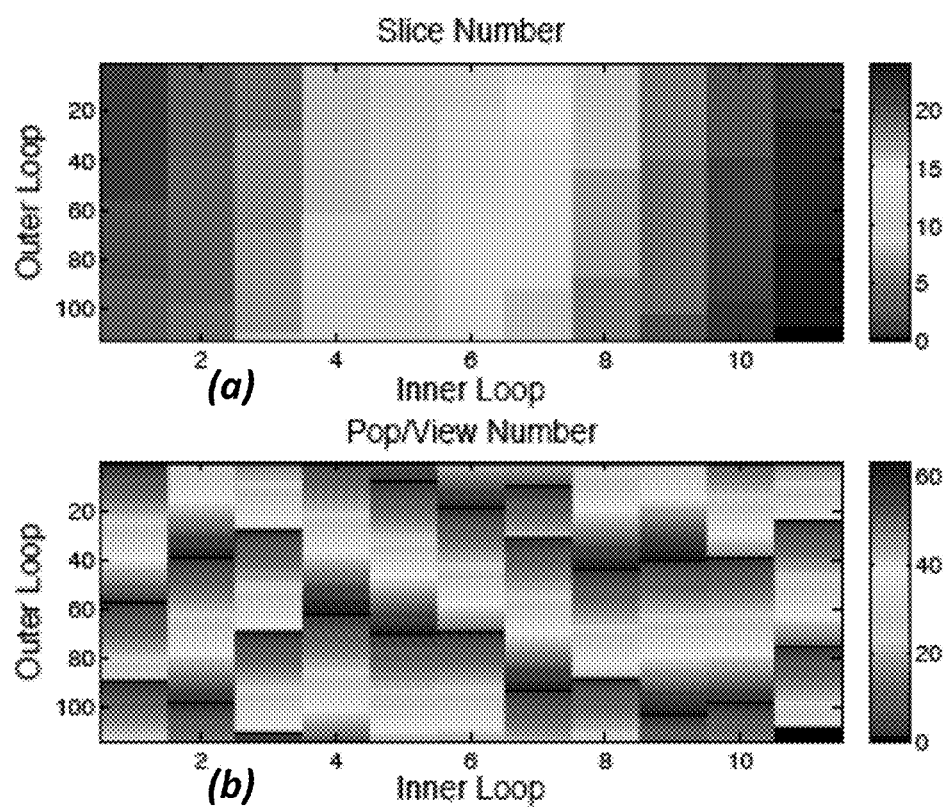
Figure 8:
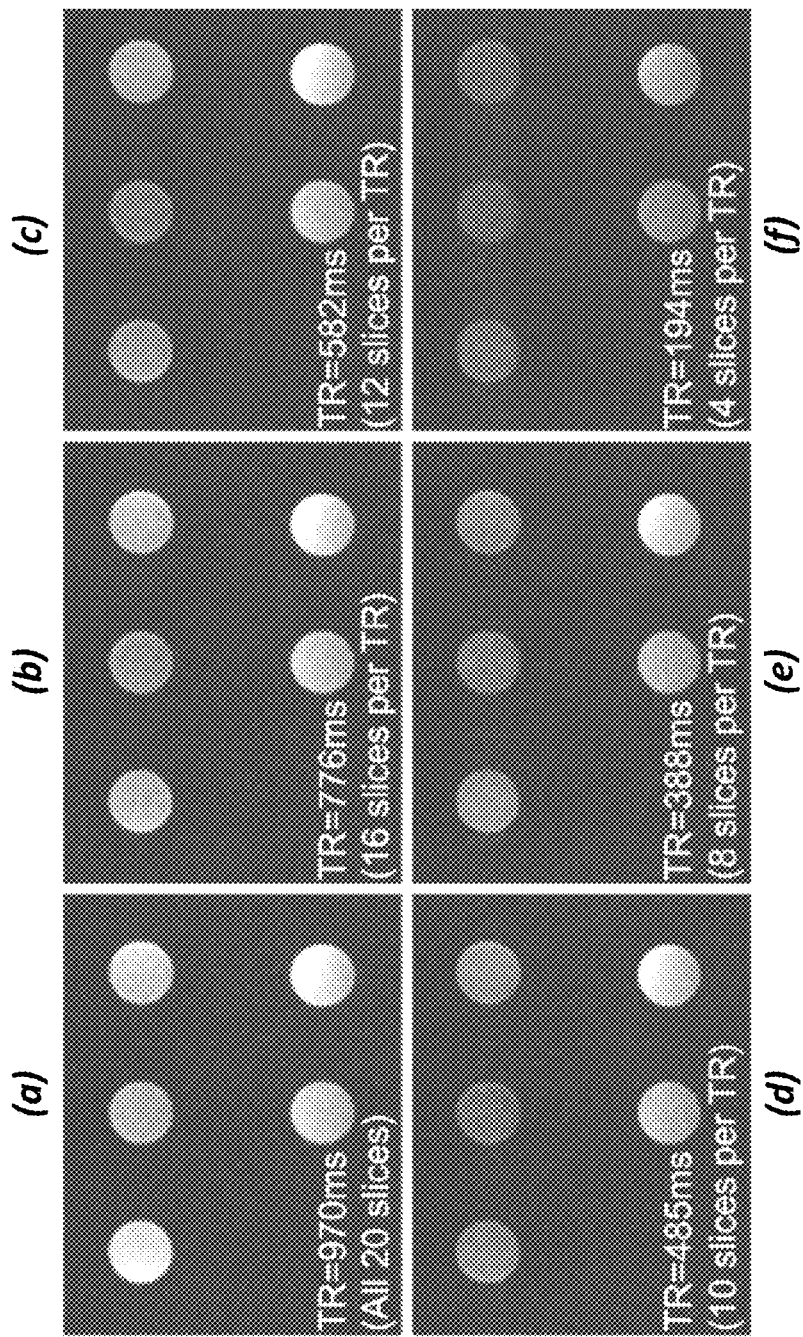
FIGS. 8a-8f show Images with a variable Ni (number of slices interleaved in each TR), and resulting variable TR, according to embodiments of the current invention.
Figure 9:
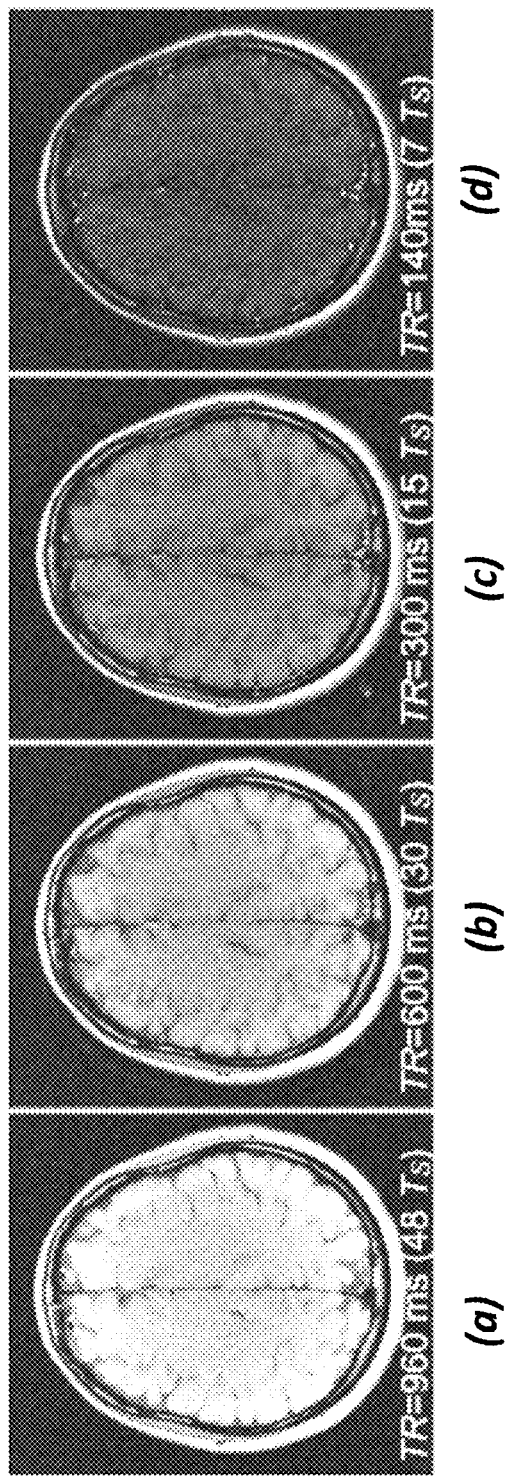
FIGS. 9a-9d show axial 512×384 brain images from a 48-slice acquisition with TR=960, 600, 300 and 140 ms, but almost identical scan times, according to embodiments of the current invention.

Turning now to an example of one embodiment of the current invention. FIGS. 2a-2c show the interleaving scheme similar to FIG. 1, which excites different slices successively within TR and plays multiple repetitions to acquire the multiple excitations for each slice. FIGS. 2a-2c show a multislice acquisition with 5 slices, each requiring 4 pops or excitations. FIG. 2a shows the simple case of TR=5TS to encompass all slices, with a total time of 20TS. This is straightforward when TR>NTS, where N is the number of slices and TS is the duration of each excitation for one slice. However, when TR<NTS, two or more acquisitions are needed, as shown in FIG. 2b, with certain slices acquired completely before others are acquired. Depending on the TS and desired TR and number of slices, this can result in a substantial overall scan time increase. Here, the desired TR of 3TS results in 2 acquisitions and possibly loss of efficiency (8 TRs or 24TS). FIG. 2c shows the current invention. For a given TR, TS and number of slices, the total number of TRs required is estimated. The required excitations for each slice are filled vertically in a matrix, incrementing to the next slice as appropriate. The slices are then excited by playing out this matrix across, then down, resulting in near 100% time efficiency for any choice of TR. Note that a dummy view is placed on the top row of the matrix, and also each time the slice number increments vertically, resulting in up to N additional dummy views, which has a negligible effect on total scan time. Here, filling the required excitations for each slice vertically allows near-perfect efficiency (7 TRs or 21TS). In most cases the efficiency gain over FIG. 2b is even greater, and can approach a factor of 2 in the worst cases.

Several examples are given using this algorithm in FIGS. 3a-7b. Each figure shows the resulting order matrix with slice number (top) and excitation or pop within each slice (bottom). Both matrices are read out row-by-row during the scan, starting at the top left corner.

Regarding a fractional number of acquisitions, the first two examples are a multislice ordering with all slices acquired in 1 TR (FIGS. 3a-3b), and with only half the slices acquired in TR, but with 2 acquisitions (FIGS. 4a-4b). These are equivalent to standard approaches, though the flexible algorithm will produce these results where appropriate. FIGS. 3a-3b show standard multislice interleaving, where acquisition starts in the top left, and goes across then down, thus alternating between slices, with each slice excited exactly once per TR. FIGS. 4a-4b show standard interleaving with 2 consecutive acquisitions. Half of the slices are excited in each TR, and once all excitations for each slice are acquired, the other half of the slices are excited in each TR. The total number of excitations is the same as in FIGS. 3a-3b.

A third example (see FIGS. 5a-5b) shows how the flexible ordering scheme can be used to efficiently cover all slices, but with a TR that is between those of the first two examples. Effectively this gives 1.5 acquisitions. Two thirds of the slices are interleaved in each TR, but ordered such that the total number excitations is the same as in either FIGS. 3a-3b or FIGS. 4a-4b.

According to a further embodiment of the invention, variable excitations per slice are provided, where two examples (see FIGS. 6a-6b and FIGS. 7a-7b) show cases where the same flexible scheme can be used to efficiently order slices where (for arbitrary reasons) different slices require different numbers of excitations (views, pops). The example shown in FIGS. 6a-6b is flexible interleaving with a different number of excitations for each acquired slice. Again, the choice of TR can vary, as is demonstrated here. As further shown in FIGS. 7a-7b, flexible interleaving with a different number of excitations for each acquired slice is provided, but shorter TR than FIGS. 6a-6b. In the above examples, very few excitations are wasted (bottom right).

An example application is provided of one embodiment of the current invention, and specifically for demonstrating T1-weighted imaging. Often at 3T, echo trains are being used to reduce SAR, resulting in longer repetition times. With the current embodiment, the TR can be reduced almost arbitrarily as shown in FIGS. 8a-8f, where shown are images for phantom scans with varying TR. As expected, the signal is reduced for shorter TR, and the contrast between vials with different T1 values changes with TR. In this example of the current invention a spin echo sequence was used at 1.5T with a constant number of slices and $T_s$, but varying TR as different, arbitrary, multiples of $T_s$. A phantom example used 20 slices, with $T_s$=48.5 ms, and TR=970, 776, 582, 485, 388 and 194 ms; all scans required between 47 and 48 seconds. In a healthy volunteer, an 8-channel head coil and 48 axial slices were used with $T_s$=20 ms. The scans used include TR=960, 600, 300 and 140 ms, with durations ranging between 2:42 and 2:43 min. A 20 cm FOV with 512°—384 matrix and 50% partial $k_y$ acquisition was used.

FIGS. 9a-9d show similar results in the brain. Additionally, the relative signal of vessels is increasingly bright as the TR is reduced, as expected from the time-of-flight effect.

In this case, the overall scan time is 47 sec for all cases, but the contrast varies based on the number of slices in each TR. Example images from this technique obtained when a variable number of slices is interleaved in each TR are provided. All scans have a total duration of 47 sec, but the amount of T1 contrast varies with the TR. Note the contrast between the upper and lower vials of doped water, which changes with the TR.

The embodiments of the current invention apply to ordering of interleaved slices or slabs. It is separate from view-ordering schemes including centric, elliptic-centric, segmented or interleaved EPI and echo-ordering schemes for multiple-echo-train imaging such as center-out, sequential and T2-weighted echo orders. However, all of these schemes are completely compatible with the methods of the current invention. All is required is to map the views/pops from this technique to different view ordering schemes.

Other view-order variations include partial Fourier acquisition, parallel imaging acquisitions and randomized acquisitions. Again, the current invention is completely compatible with these options. In cases where it may be advantageous to vary the parallel imaging or randomized acquisition with slice number, this slice-ordering technique is particularly useful.

Note that interleaved slices are typically excited in orders such as to avoid slice-to-slice saturation effects. An example is to excite odd then even slices. By first determining the overall order, the physical slice numbers here can be assigned to arbitrary slices in the ordering scheme. The odd-then-even order can be achieved by assigning the first $N_s/2$ slice order slots to odd physical slice locations, then the remaining slices to even physical slice locations.

Another interesting application arises with multiple slab imaging. If multiple 3D slabs are interleaved, and imaged, it is quite possible that the slabs may be of different sizes, requiring a different number of excitations for imaging. Again, this flexible interleaving algorithm will solve this problem.

The key strategy for flexible and efficient interleaving is to allow arbitrary slice numbers to be excited at different positions within the repetition. These methods according to the current invention are compatible with all standard imaging methods such as parallel imaging and partial-Fourier imaging. It is possible to incorporate different interleave orders such as "odd-then-even" or "bit-reversed" schemes to reduce cross-talk between excited slices. Additionally, the current invention completely supports many schemes where different slices may require a different number of excitations, such as using a varying field-of-view or matrix size is for different slices. The invention can also be applied to imaging with longer echo trains, though for proton-density-weighted or T2-weighted imaging TR can be increased to fit all slices. For T1-weighted imaging, there may be additional advantages of this approach at 3T, where the slice time TS may be increased due to either to SAR limitations or to the use of echo trains to reduce flip angles and SAR, while a short TR is still desired.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example interleaved proton-density, T1-weighted or T2-weighted spin echo or gradient echo imaging methods, with and without magnetization preparation blocks, with or without cardiac or respiratory triggering.

All such variations are considered to be within the scope and spirit of the present invention as defined by the following claims and their legal equivalents.

What is claimed:

1. A method of ordering slices for interleaved magnetic resonance imaging (MRI), comprising:
   a. selecting a number of interleaved slice locations ($N_S$) using an MRI machine, wherein each said interleaved slice comprises a plurality of excitations ($N_{E,S}$) where S is the slice number between 1 and $N_S$ and $N_{E,S}$ may differ for different slice numbers;
   b. selecting an excitation duration ($T_S$) of each said excitation in each said slice using said MRI machine;

c. selecting a repetition time (TR) using said MRI machine between successive excitations of the same slice, wherein said TR has a duration of $N_i \times T_S$, wherein $N_i$ is the number of interleaved slices per TR period; and d. arranging the order for said slices such that the total scan time (T) is minimized such that TR is the product of $N_i$ and $T_s$, wherein said $N_i$ can be arbitrarily chosen between 1 and $N_T/N_{E,max}$ wherein $N_T$ is the total number of excitations for all said slices and wherein $N_{E,max}$ is the maximum number of said excitations for one said slice.

2. The method of ordering slices for MRI of claim 1, wherein the order is determined by filling a matrix that has $N_i$ horizontal elements and a number of rows equal to a ratio $(N_T/N_i)$ rounded up to the nearest integer, wherein said matrix is filled one column at a time with the $N_{E,S}$ excitations for each of said $N_S$ slices, and then the order is played out from said matrix along the rows to interleave said excitations for each slice.

3. The method of ordering slices for MRI of claim 1, wherein at least one 'dummy' acquisition is disposed to precede said $N_{E,S}$ excitations and disposed to acquire each said slice with a result that said dummy acquisition is played each time said slice number differs from said excitation that was played $N_i$ acquisition periods prior to a current acquisition, wherein a steady-state acquisition is achieved.

4. The method of ordering slices for MRI of claim 1, wherein a 'dummy' acquisition is played for the first one or more entire TR periods with data discarded, wherein a steady state may form prior to acquisition for each slice.

5. The method of ordering slices for MRI of claim 1, wherein said method is used with arbitrary ordering schemes of said excitations for each slice, selected from the group consisting of random, centric, elliptic-centric, segmented Echo Planar Imaging (EPI), interleaved EPI, interleaved radial and interleaved spiral.

6. The method of ordering slices for MRI of claim 1, wherein said method is used with arbitrary echo-train ordering schemes selected from the group consisting of random, center-out, sequential, intermediate-weighted and T2-weighted echo orders.

7. The method of ordering slices for MRI of claim 1, wherein said method comprises arbitrary view coverage schemes selected from the group consisting of partial Fourier acquisition, parallel imaging acquisitions and randomized undersampled acquisitions.

8. The method of ordering slices for MRI of claim 1, wherein said slice numbers are reassigned arbitrarily to ordered slices to result in a different final ordering.

9. The method of ordering slices for MRI of claim 1, wherein said ordering is formed by determining an the overall order using said MRI machine, wherein said slice numbers are then reassigned to arbitrary slices, wherein an odd-then-even order is achieved by assigning odd physical slices to the first $N_S/2$ ordered slices, and the even physical slice locations are assigned to the remaining ordered slices.

* * * * *

UNITED STATES PATENT AND TRADEMARK OFFICE
CERTIFICATE OF CORRECTION

PATENT NO. : 8,803,523 B2  
APPLICATION NO. : 13/366086  
DATED : August 12, 2014  
INVENTOR(S) : Brian A. Hargreaves It is certified that error appears in the above-identified patent and that said Letters Patent is hereby corrected as shown below:

Please amend the Letters Patent in Column 1, line 3 by including the following statement, which was present in the filed patent application and published application, but omitted in the Letters Patent.

STATEMENT OF GOVERNMENT SPONSORED SUPPORT

This invention was made with Government support under contract EB008190 awarded by the National Institutes of Health. The Government has certain rights in the invention.

Signed and Sealed this  
Seventh Day of April, 2015

Michelle K. Lee  
*Director of the United States Patent and Trademark Office*